United States Patent [19]

Fukuda

[11] Patent Number: 4,617,588
[45] Date of Patent: Oct. 14, 1986

[54] FEEDBACK TYPE COMB FILTER

[75] Inventor: Hasatoshi Fukuda, Yokohama, Japan

[73] Assignee: Victor Company of Japan, Ltd., Yokohama, Japan

[21] Appl. No.: 674,544

[22] Filed: Nov. 26, 1984

[30] Foreign Application Priority Data

Nov. 26, 1983 [JP] Japan ............................... 58-222709

[51] Int. Cl.⁴ ............................................... H04N 9/78
[52] U.S. Cl. ......................................... 358/31; 358/37
[58] Field of Search .................... 358/31, 21 R, 36, 37

[56] References Cited

U.S. PATENT DOCUMENTS

| 4,468,689 | 8/1984 | Nagashima | 358/31 |
| 4,498,100 | 2/1985 | Bunting | 358/31 |
| 4,553,158 | 11/1985 | Acampora | 358/31 |

*Primary Examiner*—Michael A. Masinick
*Attorney, Agent, or Firm*—Ladas & Parry

[57] ABSTRACT

A feedback type comb filter comprises a first delay circuit supplied with an input signal, a first adding circuit supplied with an output of the first delay circuit, a second delay circuit supplied with an output of the first adding circuit, a second adding circuit supplied with an output of the second delay circuit and the input signal which is passed through a signal path having a delay time $\tau_3$, and a feedback path including a coefficient multiplier for multiplying a coefficient k to an output of the second adding circuit. The feedback path has a delay time $\tau_2$ and supplies the output of the second adding circuit to the first adding circuit through the coefficient multiplier. The first adding circuit adds the output of the first delay circuit and the signal from the feedback path, and supplies the output thereof to the second delay circuit. A delay time $\tau_1$ of the first delay circuit is equal to a sum of the delay time $\tau_2$ of the feedback path and the delay time $\tau_3$ of the signal path. A delay time $T_H$ of the second delay circuit is equal to a value which is smaller than a predetermined time $T_P$ by the delay time $\tau_2$ of the feedback path, where the predetermined time $T_P$ corresponds to a frequency interval between center frequencies of two adjacent pass bands in a comb filter characteristic of the comb filter.

5 Claims, 7 Drawing Figures

FEEDBACK TYPE COMB FILTER

BACKGROUND OF THE INVENTION

The present invention generally relates to feedback type comb filters, and more particularly to a feedback type comb filter of a type having a feedback path for feeding back a part of an output of a delay circuit to an input of the delay circuit, which is designed so that a normal comb filter characteristic is obtained from a low-frequency range up to a high-frequency range.

Generally, as will be described later on in the specification in conjunction with drawings, a conventional feedback type comb filter comprises a delay circuit for delaying an input signal, a first adding circuit for adding the input signal and an output signal of the delay circuit and for producing an output signal as an output of the comb filter, a second adding circuit for adding the input signal and the output signal of the first adding circuit, and a coefficient multiplier provided in a feedback path from the output of the first adding circuit to the second adding circuit. When it is assumed that a delay time of the delay circuit in this conventional feedback type comb filter is equal to a time $T_P$, the comb filter has a comb filter characteristic in which the pass bands are located at frequencies which are even number multiples of $F_P/2$, where $F_P = 1/T_P$, and the attenuation bands are located at frequencies which are odd number multiples of $F_P/2$. Accordingly, when the value of $F_P$ is selected to a horizontal scanning frequency of a video signal, the comb filter may be used as a filter circuit for separating and filtering a luminance from the video signal, or may be used as a part of a noise reduction circuit for reducing a noise component within the luminance signal. When a subtracting circuit is instead of the first adding circuit described before, the comb filter may be used as a filter circuit for separating and filtering a carrier chrominance signal from the video signal.

In the conventional feedback type comb filter, a signal path is formed in which the input signal is applied to an input terminal, passed through the delay circuit, and is obtained through an output terminal. On the other hand, another signal path is formed in which the output signal of the delay circuit is passed through the coefficient multiplier, supplied to the delay circuit and passed through the delay circuit again, and is obtained through the output terminal. However, delay times of the two signal paths are different from each other. For this reason, peak frequencies in the pass band characteristics become shifted from regular frequencies. This shift of the peak frequencies from the regular frequencies, is more notable in the high-frequency range, and there is a problem in that a normal comb filter characteristic cannot be obtained.

SUMMARY OF THE INVENTION

Accordingly, it is a general object of the present invention to provide a novel and useful feedback type comb filter in which the problems described heretofore are eliminated.

Another and more specific object of the present invention is to provide a feedback type comb filter in which a delay time of a main delay circuit is set to a time which is smaller than the delay time $T_P$ of the delay circuit in the conventional feedback type comb filter by a delay time of a feedback loop which includes a coefficient multiplier, and a subsidiary delay circuit having a delay time approximately equal to the delay time of the feedback loop is provided in a stage prior to an adding circuit which adds an input signal and a fed back signal. According to the feedback type comb filter of the present invention, a first signal path is formed in which the input signal is applied to an input terminal, passed through the subsidiary delay circuit and the main delay circuit, and is obtained through an output terminal. On the other hand, a second signal path is formed in which an output signal of the main delay circuit is passed through a feedback path including the coefficient multiplier, fed back to and passed through the main delay circuit, and is obtained through the output terminal. But in the feedback type comb filter of the present invention, a delay time of the first signal path is equal to a delay time of the second signal path. Therefore, the peak frequencies of the pass bands assume the regular frequencies in all of the frequency bands, and it is possible to obtain a normal comb filter characteristic.

Other objects and further features of the present invention will be apparent from the following detailed description when read in conjunction with the accompanying drawings.

DETAILED DESCRIPTION

Figure 1:
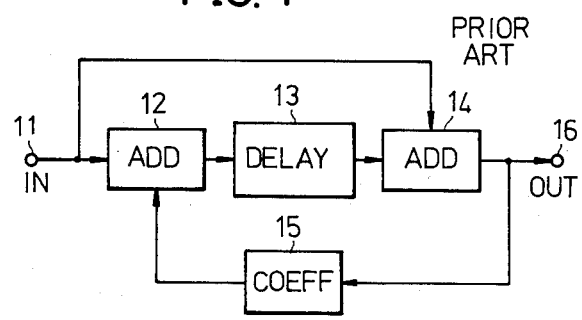
FIG. 1 is a systematic block diagram showing an example of a conventional feedback type comb filter.

A conventional feedback type comb filter has a circuit construction shown in FIG. 1, for example. An input video signal applied to an input terminal 11, is supplied to a delay circuit 13 through a first adding circuit 12. The input video signal is also supplied to a second adding circuit 14. The delay circuit 13 has a delay time $T_P$ which is equal to one horizontal scanning period (1H) of the video signal, for example. An output delayed signal of the delay circuit 13, is added with the input video signal from the input terminal 11 in the second adding circuit 14. An output signal of the second adding circuit 14 is obtained through an output terminal 16. At the same time, the output signal of the second adding circuit 14 is supplied to a coefficient multiplier 15 which multiplies a coefficient k to the signal. An output signal of the coefficient multiplier 15 is supplied to the first adding circuit 12 and is added with the input video signal from the input terminal 11.

Figure 2:
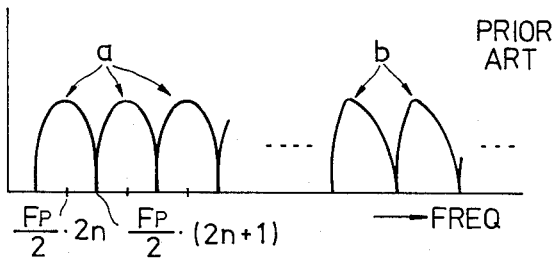
FIG. 2 shows a filter characteristic of the conventional feedback type comb filter shown in FIG. 1.

The conventional feedback type comb filter shown in FIG. 1, has a comb filter characteristic shown in FIG. 2. As is well known, in the comb filter characteristic shown in FIG. 2, center frequencies of the pass bands are equal to even number multiples of $F_P/2$, that is, 2n times $F_P/2$, where $F_P=1/T_P$ and n is an integer. On the other hand, center frequencies of the attenuation bands are equal to odd number multiples of $F_P/2$, that is, $(2n+1)$ times $F_P/2$. In a case where the delay time $T_P$ is equal to a time period of 1H, the frequency $F_P$ is equal to the horizontal scanning frequency, and in this case, a luminance signal within the input video signal is separated and obtained through the output terminal 16.

In the conventional feedback type comb filter shown in FIG. 1, a signal path is formed in which the input video signal is applied to the input terminal 11, passed through the first adding circuit 12, the delay circuit 13, and the second adding circuit 14, and is obtained through the output terminal 16. On the other hand, another signal path is formed in which the output signal of the second delay circuit 14 is passed through the coefficient multiplier 15, the first adding circuit 12, the delay circuit 13, and the second adding circuit 14, and is obtained through the output terminal 16. However, delay times of the two signal paths are different from each other. For this reason, peak frequencies in the pass bands become shifted from regular frequencies of $(F_P/2)\cdot 2n$, and each of the comb filter characteristics in the pass band becomes distorted in a non-symmetrical manner. As may be seen from FIG. 2, comb filter characteristics a in the relatively low-frequency range are close to the normal comb filter characteristics. However, the distortions in the the comb filter characteristics in the high-frequency range become greater in the high-frequency range. In a high-frequency range of over 2 MHz or 3 MHz, for example, comb filter characteristics b are greatly distorted from the normal comb filter characteristics.

Figure 3:
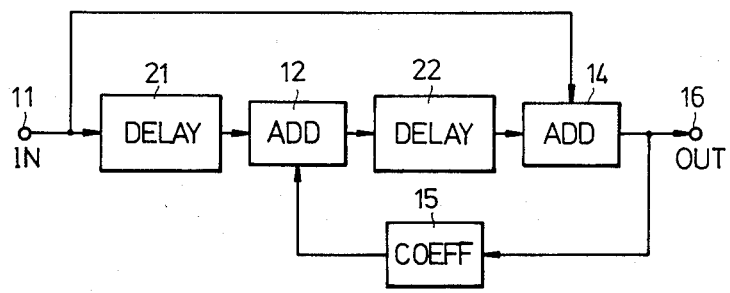
FIG. 3 is a systematic block diagram showing an embodiment of a feedback type comb filter according to the present invention.

The feedback type comb filter according to the present invention is designed to eliminate the disadvantages of the conventional feedback type comb filter described heretofore. FIG. 3 is a systematic block diagram showing an embodiment of the feedback type comb filter according to the present invention. In FIG. 3, those parts which are the same as those corresponding parts in FIG. 1 are designated by the same reference numerals, and their description will be omitted.

In the feedback type comb filter according to the present invention, a main delay circuit 22 corresponding to the delay circuit 13 which is coupled between the first and second adders 12 and 14 in the conventional feedback type comb filter, has a delay time $T_H$. The delay time $T_H$ is smaller than a predetermined time $T_P$ by a delay time $\tau_2$ of a feedback loop which extends from the output of the second adding circuit 14, passes through the coefficient multiplier 15, and reaches the input of the first adding circuit 12. The predetermined time $T_P$ corresponds to a frequency interval between center frequencies of two adjacent pass bands in the comb filter characteristic which is to be obtained, and the predetermined time $T_P$ is equal to 1H in the present embodiment. In other words, $T_H = 1H - \tau_2$. A subsidiary delay circuit 21 is coupled between the input terminal 11 and the first adding circuit 12, so as to delay the input video signal by a delay time $\tau_1$.

Figure 4:
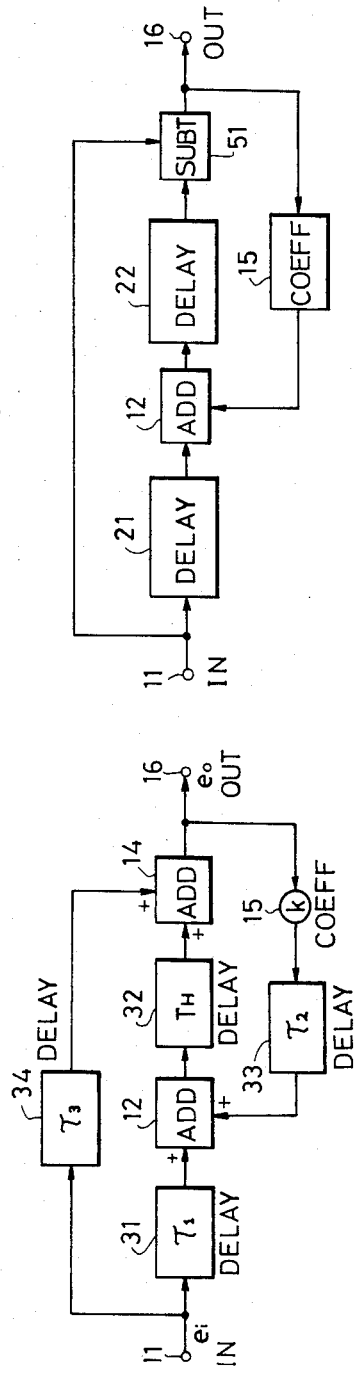
FIG. 4 is an equivalent circuit diagram showing delay factors in the feedback type comb filter shown in FIG. 3.

FIG. 4 is an equivalent circuit diagram showing delay factors in the feedback type comb filter shown in FIG. 3. The delay time $\tau_1$ of a delay factor 31 represents the delay time of the subsidiary delay circuit 21. The delay time $T_H$ of a delay factor 32 represents the delay time of the main delay circuit 22. The delay time $\tau_2$ of the a delay factor 33 represents the delay time of the feedback path including the coefficient multiplier 15. Further, a delay time $\tau_3$ of a delay factor 34 represents the delay time of the signal path from the input terminal 11 directly to the second adding circuit 14.

it will now be assumed that an input signal having a voltage $e_i$ is applied to the input terminal 11, and an output signal having a voltage $e_o$ is obtained through the output terminal 16. In this case, the transfer function of the comb filter shown in FIGS. 3 and 4 may be described by the following equation (1), where $\omega$ represents the angular frequency of the input signal.

$$e_o/e_i = [e^{-j\omega\tau_3} + e^{-j\omega(T_H+\tau_1)}]/[1 - ke^{-j\omega(T_H+\tau_2)}] \quad (1)$$

$$\doteq e^{-j\omega\tau_3} \cdot [1 + e^{-j\omega(T_H+\tau_1-\tau_3)}]/[1 - ke^{-j\omega(T_H+\tau_2)}]$$

when it is assumed that the following equation (2) stands, and a delay factor $e^{-j\omega\tau_3}$ of the circuit as a whole is omitted, the equation (1) may be rewritten as the following equation (3).

$$\left.\begin{array}{l} \tau_1 - \tau_3 = T_i \\ \tau_2 = T_f \end{array}\right\} \quad (2)$$

$$e_o/e_i = [1 + e^{-j\omega(T_H+T_i)}]/[1 - ke^{-j\omega(T_H+T_f)}] \quad (3)$$

Figure 5:
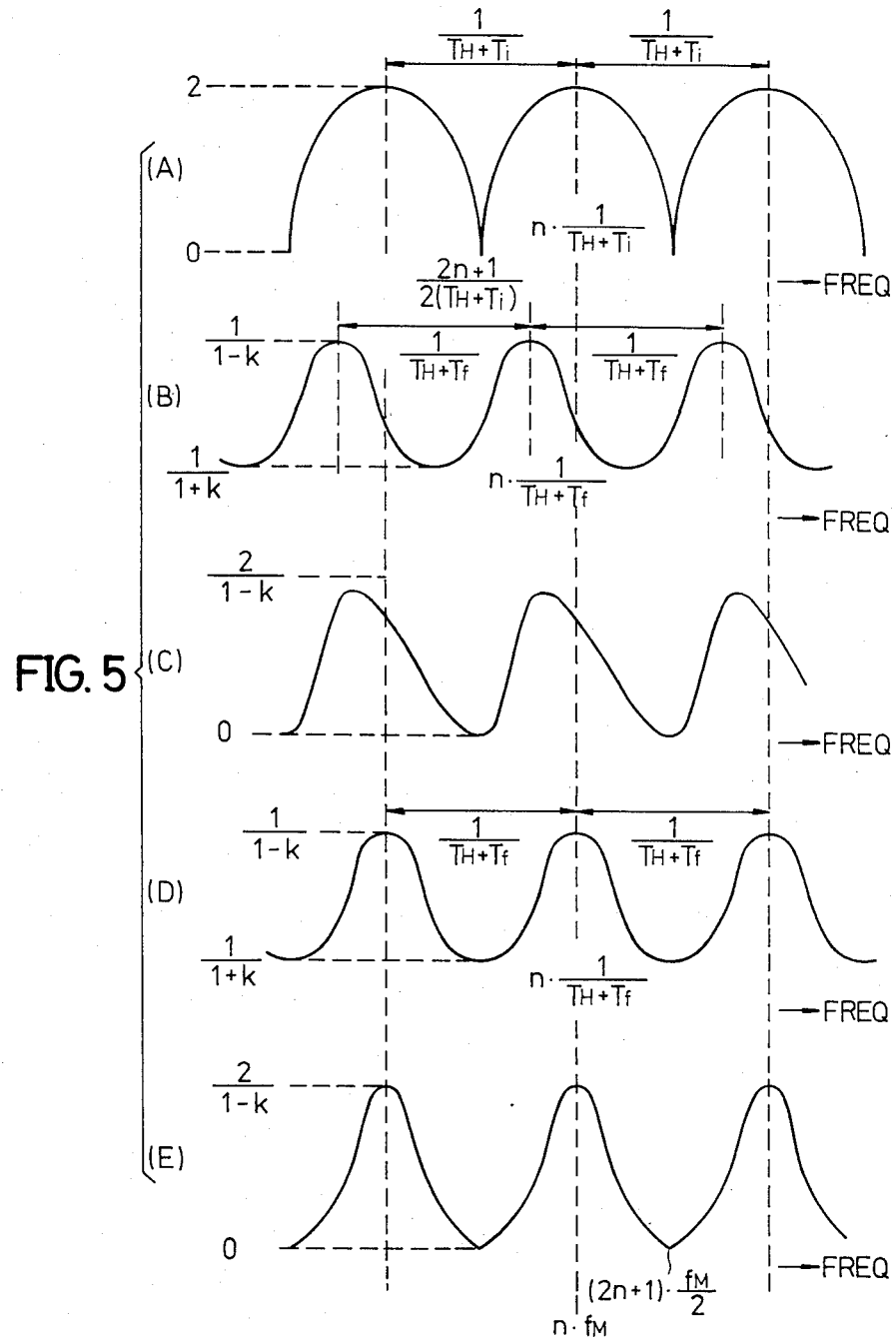
FIGS. 5(A) through 5(E) are graphs for explaining comb filter characteristics.

When the numerator $1+e^{-j\omega(T_H+T_i)}$ in the equation (3) is illustrated, a comb filter characteristic shown in FIG. 5(A) is obtained. In the comb filter characteristic shown in FIG. 5(A), the center frequencies of the pass bands are even number multiples of (that is, 2n times) the frequency $1/[2(T_H+T_i)]$, and are equal to $n/(T_H+T_i)$. On the other hand, the center frequencies of the attenuation bands are odd number multiples of (that is, $(2n+1)$ times) the frequency $1/[2(T_H+T_i)]$. The maximum level is "2", and the minimum level is "0" in the comb filter characteristic shown in FIG. 5(A). An interval between the center frequencies of two adjacent pass bands, is equal to $1/(T_H+T_i)$. The delay times are used in the description given above, however, an inverse number of the time indicates the frequency. Thus, in FIG. 5, the horizontal axis represents the frequency.

On the other hand, when the inverse number of the denominator in the equation (3), that is, $1/[1-ke^{-j\omega(T_H+T_f)}]$, is illustrated, a characteristic shown in FIG. 5(B) is obtained. In the characteristic shown in FIG. 5(B), the center frequencies of the pass bands are even number multiples of $1/[2(T_H+T_f)]$, and are equal to $n/[2(T_H+T_f)]$. The center frequencies of the attenuation bands are odd number multiples of $1/[2(T_H+T_f)]$. The maximum level is $1/(1-k)$, and the minimum level is $1/(1+k)$.

The characteristic of the transfer function described by the equation (3), is a product of the two characteristics shown in FIGS. 5(A) and 5(B). For this reason, in a case where the center frequencies $n/(T_H+T_i)$ and $n/(T_H+T_f)$ of the pass bands in the two characteristics do not coincide, the characteristic of the transfer function described by the equation (3) becomes as shown in FIG. 5(C).

As may be seen from FIGS. 5(A) through 5(C), in the case where the center frequencies of the pass bands in the two characteristics shown in FIGS. 5(A) and 5(B) do not coincide, the peak frequencies of the pass bands in the characteristic shift from the center frequencies of the pass bands as shown in FIG. 5(A). As a result, the characteristic shown in FIG. 5(C) is non-symmetrical about the center frequencies of the pass bands, and the characteristic is distorted compared to the original characteristic which is symmetrical about the center frequencies of the pass bands.

However, when the frequencies $n/(T_H+T_i)$ and $n/(T_H+T_f)$ are equal in the characteristics shown in FIGS. 5(A) and 5(D), that is, when the following equation (4) stands, a characteristic shown in FIG. 5(E) is obtained as a product of the two characteristics shown in FIGS. 5(A) and 5(D).

$$T_i = T_f \tag{4}$$

In the characteristic shown in FIG. 5(E), the peak frequencies of the pass bands coincide with the center frequencies $(=n/(T_H+T_i)=n/(T_H+T_f))$ of the pass bands. The characteristic is symmetrical about the center frequencies of the pass bands and is symmetrical about the center frequencies of the attenuation bands. Thus, the characteristic shown in FIG. 5(E) is a normal comb filter characteristic.

In a case where the feedback type comb filter according to the present invention is used as a filter for separating and filtering a luminance signal from the video signal, the condition described by the following equation (5) must be satisfied, because it is necessary to obtain a comb filter characteristic in which the center frequencies of the pass bands are even number multiples of 1/2H and the center frequencies of the attenuation bands are odd number multiples of 1/(2H).

$$T_H + T_i = T_H + T_f = 1H \tag{5}$$

As a result, a frequency interval between the center frequencies of two adjacent pass bands becomes equal to the horizontal scanning frequency $f_H(=1/1H)$. Hence, the center frequencies of the pass bands become equal to even number multiples of $f_H/2$, that is, equal to $n \cdot f_H$. On the other hand, the center frequencies of the attenuation bands become equal to odd number multiples of $f_H/2$, that is, equal to $(2n+1) \cdot f_H/2$.

Accordingly, from the conditions described by the equations (4) and (5), the delay time $T_H$ of the main delay circuit 22 is selected to a time of $1H - T_f = 1H - \tau_2$, that is, selected to a value which is smaller than 1H by the delay time $\tau_2$ of the feedback path. In addition, from the equations (2) and (4), the delay time $\tau_1$ of the subsidiary delay circuit 21 is selected to a time of $T_i + \tau_3 = \tau_2 + \tau_3$, that is, selected to a value which is larger than the delay time $\tau_2$ of the feedback path by the delay time $\tau_3$.

In a case where the delay time $\tau_3$ of the signal path from the input terminal 11 to the second adding circuit 14 is small and negligible, the delay time $\tau_1$ of the subsidiary delay circuit 21 may be selected to a value which is approximately equal to the delay time $\tau_2$ of the feedback path.

As described heretofore, when the conditions described by the equations (4) and (5) are satisfied, it is possible to obtain from the feedback type comb filter shown in FIG. 3 a regular comb filter characteristic in which the peak frequencies of the pass bands coincide with the center frequencies of the pass bands as shown in FIG. 5(E).

Figure 6:
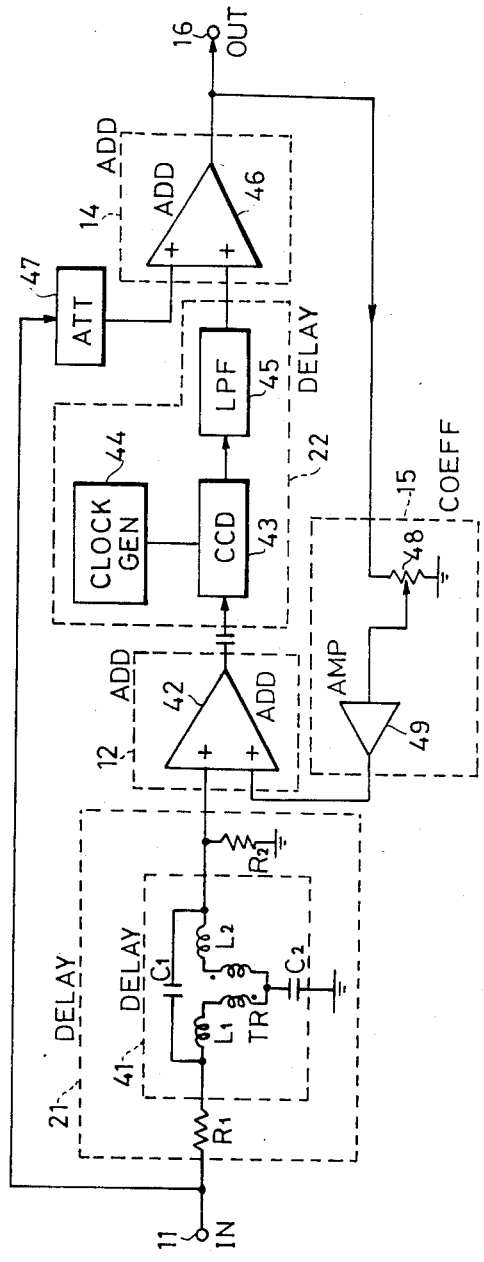
FIG. 6 is a systematic circuit diagram showing an embodiment of a concrete circuit of the feedback type comb filter shown in FIG. 3.

An embodiment of a concrete circuit of the feedback type comb filter shown in FIG. 3, will now be described by referring to FIG. 6. In FIG. 6, those parts which are the same as those corresponding parts in FIG. 3 are designated by the same reference numerals.

In FIG. 6, the subsidiary delay circuit 21 comprises a delay circuit 41 and resistors $R_1$ and $R_2$. The delay circuit 41 comprises coils $L_1$ and $L_2$, capacitors $C_1$ and $C_2$, and a transformer TR. The first adding circuit 12 comprises an adder 42. The main delay circuit 22 comprises a charge coupled device (CCD) 43, a clock pulse generator 44 for supplying a clock pulse to the CCD 43, and a lowpass filter 45 for eliminating a clock component which is mixed into an output signal of the CCD 43. The second adding circuit 14 comprises an adder 46. An attenuator 47 is provided in a signal path between the input terminal 11 and the second adding circuit 14, so as to match the levels of the signals which are added in the second adding circuit 14. The coefficient multiplier 15 which is coupled between the output of the second adding circuit 14 and the input of the first adding circuit 12, comprises a variable resistor 48 which may be variably adjusted so that the coefficient k becomes equal to 0.5, for example, and an amplifier 49.

In the present embodiment, the delay time $\tau_3$ of the signal path which starts from the input terminal 11 and reaches the input of the second adding circuit 14 through the attenuator 47, is approximately equal to zero. Further, the delay time $\tau_2$ of the coefficient multiplier 15 is approximately equal to 20 nano-seconds (nsec). For this reason, the constants of the circuit elements constituting the delay circuit 41 of the subsidiary delay circuit 21, are selected to values so that the delay time $\tau_1$ of the subsidiary delay circuit 21 is approximately equal to 20 nsec. In addition, the delay time $T_H$ of the main delay circuit 22 is selected to (1H−20 nsec). The delay times $\tau_1$ and $\tau_2$ respectively assume values which are in the range of several tens of nsec. The object of the present invention may also be achieved when a non-linear circuit such as a limiter circuit, or a frequency selecting circuit such as a highpass filter and a bandpass filter, is coupled to the coefficient multiplier 15 according to the needs.

Figure 7:
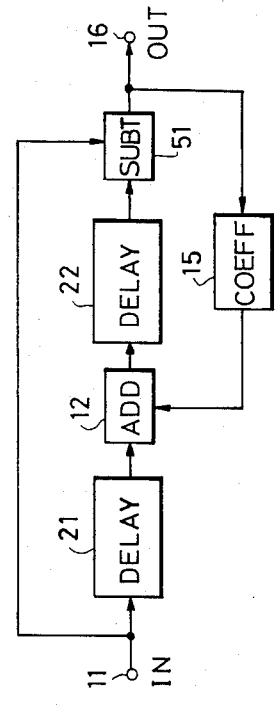
FIG. 7 is a systematic block diagram showing a modification of a feedback type comb filter according to the present invention.

In a case where the feedback type comb filter according to the present invention is used to separate and filter a carrier chrominance signal from the video signal, a subtracting circuit 51 shown in FIG. 7 is used instead of the second adding circuit 14 shown in FIG. 3. In FIG. 7, those parts which are the same as those corresponding parts in FIG. 3 are designated by the same reference numerals, and their description will be omitted. An adding circuit may be used for the subtracting circuit 51, by inverting the polarity of an input signal to one of two input terminals of the subtracting circuit 51. According to this modification, it is possible to obtain a comb filter characteristic in which the center frequencies of the attenuation bands are even number multiples of the frequency $f_H/2$, and the center frequencies of the pass bands are odd number multiples of the frequency $f_H/2$. Hence, it is possible to eliminate the luminance signal from the video signal and obtain the carrier chrominance signal.

Further, the present invention is not limited to these embodiments, but various variations and modifications may be made without departing from the scope of the present invention.

What is claimed is:
1. A feedback type comb filter comprising:
   a first delay circuit supplied with an input signal which is applied to an input terminal, for delaying the input signal by a predetermined delay time $\tau_1$;
   a first adding circuit supplied with an output signal of said first delay circuit;

a second delay circuit supplied with an output signal of said first adding circuit, for delaying the output signal of said first adding circuit by a predetermined delay time $T_H$;

a second adding circuit supplied with an output signal of said second delay circuit and the input signal which is applied to said input terminal and is passed through a signal path having a delay time $\tau_3$, for adding the two signals supplied thereto, an output signal of said second adding circuit being obtained through an output terminal as an output signal of said comb filter; and a feedback path including a coefficient multiplier for multiplying a coefficient k to the output signal of said second adding circuit, said feedback path having a delay time $\tau_2$ and supplying the output signal of said second adding circuit to said first adding circuit through said coefficient multiplier, said first adding circuit adding the output signal of said first delay circuit and the signal from said feedback path, and supplying the output signal thereof to said second delay circuit, said delay time $\tau_1$ of said first delay circuit being equal to a sum of the delay time $\tau_2$ of said feedback path and the delay time $\tau_3$ of said signal path, said delay time $T_H$ of said second delay circuit being equal to a value which is smaller than a predetermined time $T_P$ by said delay time $\tau_2$ of said feedback path, said predetermined time $T_P$ corresponding to a frequency interval between center frequencies of two adjacent pass bands in a comb filter characteristic of said comb filter.

2. A feedback type comb filter as claimed in claim 1 in which said input signal applied to said input terminal is a video signal, and said delay time $T_H$ of said second delay circuit is equal to a value which is smaller than one horizontal scanning period of said video signal by said delay time $\tau_2$ of said feedback path.

3. A feedback type comb filter as claimed in claim 1 in which said delay time $\tau_3$ of said signal path is negligibly small, and said delay time $\tau_1$ of said first delay circuit is equal to said delay time $\tau_2$ of said feedback path.

4. A feedback type comb filter as claimed in claim 3 in which said delay times $\tau_1$ and $\tau_2$ are respectively equal to values in a range of several tens of nsec.

5. A feedback type comb filter comprising:

a first delay circuit supplied with an input signal which is applied to an input terminal, for delaying the input signal by a predetermined delay time $\tau_1$;

an adding circuit supplied with an output signal of said first delay circuit;

a second delay circuit supplied with an output signal of said adding circuit, for delaying the output signal of said adding circuit by a predetermined delay time $T_H$;

a subtracting circuit supplied with an output signal of said second delay circuit and the input signal which is applied to said input terminal and is passed through a signal path having a delay time $\tau_3$, for performing a subtraction between the two signals supplied thereto, an output signal of said subtracting circuit being obtained through an output terminal as an output signal of said comb filter; and a feedback path including a coefficient multiplier for multiplying a coefficient k to the output signal of said subtracting circuit, said feedback path having a delay time $\tau_2$ and supplying the output signal of said subtracting circuit to said adding circuit through said coefficient multiplier, said adding circuit adding the output signal of said first delay circuit and the signal from said feedback path, and supplying the output signal thereof to said second delay circuit, said delay time $\tau_1$ of said first delay circuit being equal to a sum of the delay time $\tau_2$ of said feedback path and the delay time $\tau_3$ of said signal path, said delay time $T_H$ of said second delay circuit being equal to a value which is smaller than a predetermined time $T_P$ by said delay time $\bar{\tau}_2$ of said feedback path, said predetermined time $T_P$ corresponding to a frequency interval between center frequencies of two adjacent pass bands in a comb filter characteristic of said comb filter.

* * * * *